United States Patent
Thewes et al.

[11] Patent Number: 5,939,945
[45] Date of Patent: Aug. 17, 1999

[54] AMPLIFIER WITH NEURON MOS TRANSISTORS

[75] Inventors: Roland Thewes, Groebenzell; Werner Weber, Munich; Andreas Luck, Munich; Erdmute Wohlrab, Munich; Doris Schmitt-Landsiedel, Ottobrunn, all of Germany

[73] Assignee: Siemens Aktiengesellschaft, Munich, Germany

[21] Appl. No.: 08/900,345

[22] Filed: Jul. 25, 1997

[30] Foreign Application Priority Data

Jul. 25, 1996 [DE] Germany ................ 196 30 112

[51] Int. Cl.$^6$ ....................................... H03F 3/16
[52] U.S. Cl. .................... 330/277; 330/311; 330/293; 330/69; 327/361
[58] Field of Search ................ 330/69, 277, 293, 330/311; 326/36; 327/361

[56] References Cited

U.S. PATENT DOCUMENTS

| | | |
|---|---|---|
| 4,496,908 | 1/1985 | Takano et al. ............ 330/293 X |
| 4,935,702 | 6/1990 | Mead et al. . |
| 5,184,061 | 2/1993 | Lee et al. . |
| 5,258,657 | 11/1993 | Shibata et al. ............ 326/35 |
| 5,444,821 | 8/1995 | Li et al. . |

FOREIGN PATENT DOCUMENTS

| | | |
|---|---|---|
| 0 011 694 | 6/1980 | European Pat. Off. . |
| 0 516 847 A1 | 12/1992 | European Pat. Off. . |
| 29 38 347 A1 | 4/1991 | Germany . |
| WO95/31043 | 11/1995 | WIPO . |

OTHER PUBLICATIONS

Shibata, Tadashi et al.: "A Functional MOS Transistor Featuring Gate–Level Weighted Sum and Threshold Operations," *IEEE Transactions on Electron Devices*, vol. 39, No. 6, Jun. 1992.

*Primary Examiner*—Michael B Shingleton
*Attorney, Agent, or Firm*—Hill & Simpson

[57] ABSTRACT

Amplifier circuits having at least one neuron MOS transistor in which a coupling gate is connected to an amplifier output and at least one further coupling gate is connected with a respective amplifier input are provided. The amplifier circuit exhibits a linear transmission behavior even in large-signal operation and can be constructed using relatively few components. Furthermore, the gain is easy to set.

6 Claims, 4 Drawing Sheets

AMPLIFIER WITH NEURON MOS TRANSISTORS

BACKGROUND OF THE INVENTION

The present invention generally relates to amplifier circuits. More specifically, the present invention relates to amplifier circuits having at least one neuron MOS transistor.

In many analog switching applications, e.g. in video and audio applications, in sensor technology, in analog computers, in certain realizations of components in fuzzy circuits, in neural networks, etc., amplifier circuits and summing amplifiers are required that have a transmission behavior that is linear with respect to the large signal. For circuits of this sort, operational amplifier circuits are standardly used. These circuits are relatively expensive with respect to their technical realization in microelectronics. This means that, in particular, applications in which a large number of such circuits are used require a large space. In addition, the power consumption of the individual circuits can also be a problem in such applications. The relatively long signal-conducting lines that necessarily result in such cases for the connection of different circuits can also present problems due to their parasitic capacitance and cross-talk influences.

From the IEEE Transactions on Electron Devices, vol. 39, no. 6, June 1992, pp. 1444 to 1455, the construction and functioning of a neuron MOS transistor and its use as an amplifier or, respectively, a summing amplifier are known. The neuron MOS transistor is hereby connected as a source follower.

It is, therefore, an object of the present invention to provide an amplifier, or, respectively, a summing amplifier, that is linear with respect to a large signal that has gain factors that can be set precisely, and which can be realized using few components.

SUMMARY OF THE INVENTION

To this end, in an embodiment of the present invention, an amplifier having a neuron MOS transistor is provided. The neuron MOS transistor has a first gate connected with an amplifier input and a second gate of the neuron MOS transistor connected with an amplifier output wherein a first terminal of an apparatus for keeping a drain voltage of the neuron MOS transistor constant is connected with a constant current source and forms an amplifier output. A second terminal of the apparatus for keeping the drain voltage constant is connected with the first terminal of the neuron MOS transistor, wherein the second terminal of the neuron MOS transistor is connected with a fixed potential.

In an embodiment, the apparatus for keeping the constant drain voltage of the neuron MOS transistor has an MOS transistor whose first terminal is connected with a supply voltage via the constant current source. The first terminal of the neuron MOS transistor is connected with a second terminal of the MOS transistor, and the second terminal of the neuron MOS transistor is connected with reference potential. A gate of the MOS transistor is connected with a voltage source.

In an embodiment, the first gate effects an input weighting, and the second gate effects an output weighting wherein the weightings ensue via the surfaces of the gates. The gain factor may be set via the selection of the weighting ratio of the input weighting to the output weighting.

In an embodiment, the neuron MOS transistor has a third gate with an adjustment weighting wherein the adjustment weighting ensues over the surface of the third gate. The third gate is connected with an adjustment voltage to set the direct voltage operating point.

In an embodiment, the first terminal of the MOS transistor is connected with the gate of an additional MOS transistor whose first terminal is connected with the supply voltage and whose second terminal is connected with a reference potential via a further current source. In place of the first terminal of the MOS transistor, the second terminal of the additional MOS transistor forms the amplifier output.

In an embodiment, the neuron MOS transistor has at least one further gate with a respective further input weighting wherein the gate is connected with a respective further amplifier input such that the amplifier operates as an inverting summing amplifier.

In an embodiment, the respective gain factor can be set by the selection of the weighting ratio of the respective input weighting to the output weighting.

In an embodiment, k inputs of a first of the two amplifiers form non-inverting inputs of the summing amplifier and n inputs of a second of the two amplifiers form inverting inputs of the universal summing amplifier wherein the amplifier output of the first amplifier or, respectively, of the inverting summing amplifier is connected with a further additional gate of the neuron transistor of the second amplifier. The amplifier output of the second amplifier or, respectively, of the inverting summing amplifier, forms the amplifier output of the universal summing amplifier so as to form a universal summing amplifier.

In an embodiment, the gain factors for the non-inverting inputs can be set both by selecting a weighting ratio of the input weightings to the output weighting in the neuron MOS transistor of the first amplifier or, respectively, the inverting summing amplifier, and by selecting the weighting ratio of the input weighting of the further additional gate to the output weighting in the neuron MOS transistor of the second amplifier or, respectively, the inverting summing amplifier.

Advantages of the present invention, therefore, include that the space requirement and the power consumption of the circuits are low, that the gain factor can be set precisely via the geometry of the layout of the neuron MOS transistor used in the circuit, that the inputs of the circuits load the source operating the respective input only capacitively, which is particularly significant given the presence of high-ohm input signals, and that the circuits operate in time-continuous fashion. As a result, the problem of noise due to pulse couplings that arises in switched capacitor circuits is not a factor.

Additional features and advantages of the present invention are described in, and will be apparent from, the detailed description of the presently preferred embodiments and from the drawings.

DETAILED DESCRIPTION OF THE PRESENTLY PREFERRED EMBODIMENTS

Figure 1:
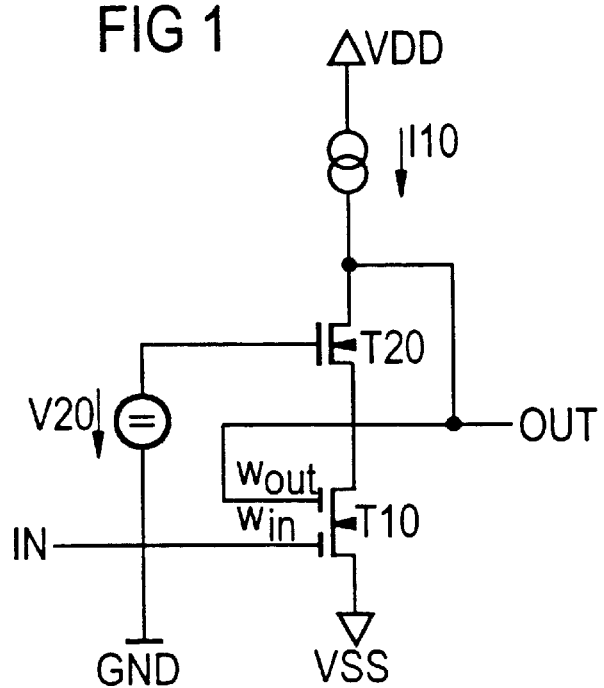
FIG. 1 illustrates an inverting amplifier in an embodiment of the present invention with a neuron MOS transistor.

With reference to the specification and accompanying drawings, ground potential GND is 0 volts, and the circuits are operated with a symmetrical supply voltage with respect to the GND potential. A positive supply voltage is designated at VDD, and a negative supply voltage is designated at VSS. Due to the symmetry of the supply voltages, VDD=−VSS. For a neuron MOSFET, a conventional symbol such as shown in Shibata et al., "Functional MOS Transistor Featuring Gate-Level Weighted Sum and Threshold Operations," *IEEE Transactions on Electron Devices*, Vol. 39, No. 6, June 1992, pp. 1444–1455 is used. As shown ad described by Shibata et al., inputs are connected with coupling gates as well as a floating gate, the channel region, and source and drain terminals.

In addition to the foregoing, the capacitance is defined between a coupling gate and the floating gate and is designated with $C_{IN,i}$. Capacitance between the floating gate FG and the channel region CH, including the source-drain overlap capacitances, is designated $C_{FG}$. The capacitance per unit length of this capacitance in the y direction, whereby the y vector is parallel to the flow of current in the channel region of the transistor, is designated $C'_{FG}$, and the following holds:

$$C'_{FG} = \frac{\partial C_{FG}}{\partial y} \quad \text{Dimension: } F/m \tag{1}$$

Weighting $w_i$ of an input refers to a ratio of the coupling capacitance $C_{IN,i}$ and a sum of all capacitances $C_{ges}$ of which one electrode represents the floating gate FG; i.e.:

$$w_i = \frac{C_{IN,i}}{C_{ges}} = \frac{C_{IN,i}}{C_{FG} + \sum_{j=1}^{n} C_{IN,j}} \tag{2}$$

Since the coupling capacitance $C_{IN,i}$ of an input $IN_i$ is proportional to the surface of the coupling gate $GK_i$, the weighting $w_i$ of an input can be set via the surface of the corresponding coupling gate. In particular, it follows from equation (2) that the ratio of the weightings of two inputs $IN_i$ and $IN_j$, with i≠j, can be set via the surface ratio of the respective coupling gate, i.e.:

$$\frac{w_i}{w_j} = \frac{C_{IN,i}}{C_{IN,j}} = \frac{\text{surface (coupling gate } GK_i)}{\text{surface (coupling gate } GK_j)}$$

The basic principle of all of the circuits shown in the accompanying figures and described hereinafter below is based on the inverting amplifier shown in FIG. 1 having an input IN and an input OUT. The circuit is constructed from the neuron MOSFET T10, an additional n-MOSFET T20, a voltage source V20 and a current source I10. The current source I10 can, for example, be realized by the output of a p-MOS current mirror, for which purpose, according to the construction of the current mirror circuit, one or two p-MOS transistors are required per current source output. The input IN of the circuit is connected with a coupling gate of the neuron MOS transistor T10 with weighting $w_{IN}$. The output OUT of the circuit is connected with a further coupling gate of the neuron MOS transistor T10 with the weighting $w_{OUT}$.

By means of the current source I10, a constant cross-current is impressed through the two transistors T10 and T20. A constant pre-voltage in the region of about 0 volts is applied to the gate of the additional n-MOSFET T20 via the voltage source V20. If the drain potential of the additional n-MOSET T20, which is at the same time the node potential of the output OUT of the circuit, is larger than V20-$V_{th,T20}$, where $V_{th,T20}$ stands for the threshold voltage of T20, the operating point of the additional n-MOFSET T20 is in the saturation range. If it is assumed that the current supplied by the current source I10 is independent of the voltage at the node OUT of the circuit, the range of all output voltages at which the operating point of the additional n-MOFSET T20 is in the saturation range represents the nominal case of operation of the circuit. Given an adequate selection of the voltage source V20, a very broad output voltage range is possible.

Since, in the nominal case of operation, the additional n-MOFSET T20 operates in saturation, a constant gate-source voltage arises at the additional n-MOSFET T20. Since, in turn, the gate potential of the additional n-MOFSET T20 is predetermined by the voltage source V20, there also results a constant source potential of the additional n-MOFSET T20, and thus also a constant drain potential of the neuron MOSFET T10.

In order to conduct the current impressed by the current source I10, a defined floating gate level $V_{FG}$ has to occur at the floating gate of the neuron MOSFET T10. The floating gate level $V_{FG}$ results via the capacitive voltage distributor of all capacitances of which one electrode represents the floating gate itself. If, in addition, a possible charging of the floating gate to a potential $V_{QP}$, caused by the process, is taken into account, the floating gate level $V_{FG}$ can be generally described by the following equation as:

$$V_{FG} = V_{QP} + w_{IN} \times V_{IN} + w_{OUT} \times V_{OUT} + \int_{Source(T10)}^{Drain(T10)} \frac{C'_{FG}(y)}{C_{ges}} V(y) dy \tag{3}$$

The integral in this equation represents the contribution via $C_{FG}$ which results from the integration over the capacitance per unit length $C'_{FG}(y)$ of the channel region and the channel potential $V(y)$ of the neuron MOSFET T10. Since the drain and source potential of the neuron MOSFET T10 are constants, and the local surface charge density in the channel region is also constant due to the fixed impressed current, the parameters $C'_{FG}(y)$ and $V(y)$ cannot change during operation. That is, the current or present values of the input and output voltage $V_{IN}$ or, respectively, $V_{OUT}$ have no influence on the value of this parameter. The integral thus represents a constant whose value is designated below as $V_{CH}$. Equation (3) can thus be transformed as follows:

$$V_{FG} = V_{QP} + w_{IN} \times V_{IN} + w_{OUT} \times V_{OUT} + V_{CH} \tag{4}$$

The solution of this equation for $V_{OUT}$ and a combination of the constants $V_{FG}$, $V_{QP}$ and $V_{CH}$ to form a constant $V_0 = V_{FG} - V_{QP} - V_{CH}$ yields:

$$V_{OUT} = \frac{1}{w_{OUT}} \times V_0 - \frac{w_{IN}}{w_{OUT}} \times V_{IN} \tag{5}$$

The following thus holds for each change, including large-signal change, $\Delta V_{OUT}$ of the output voltage $V_{OUT}$ as a function of the large-signal change $\Delta V_{IN}$ of the input voltage $V_{IN}$:

$$\Delta V_{OUT} = -v \times \Delta V_{IN} \quad (6a)$$

with $$v = \frac{w_{IN}}{w_{OUT}} \quad (6b)$$

Figure 2:
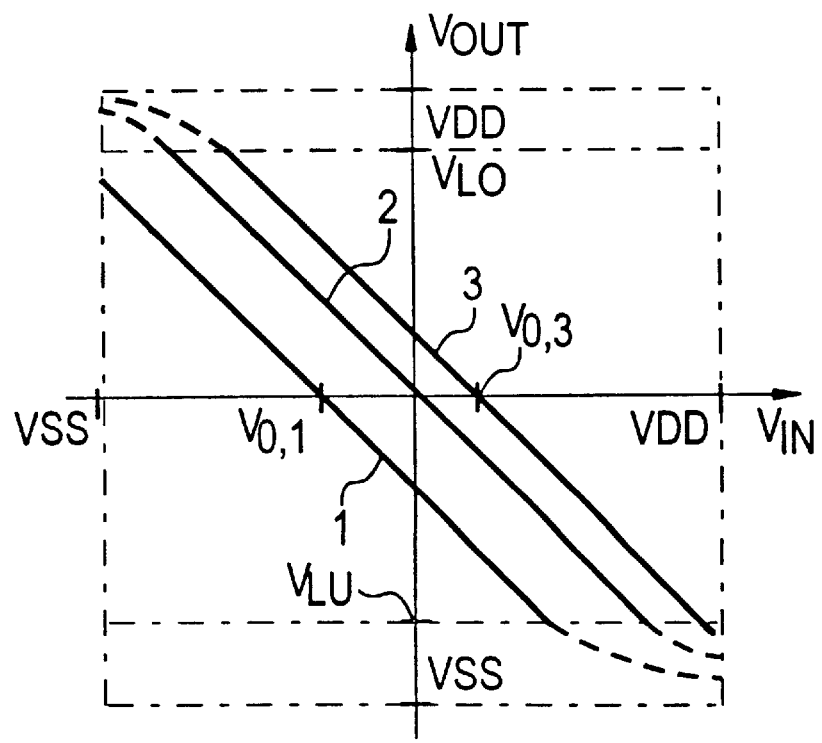
FIG. 2 shows a schematic view of the transmission behavior of the circuit from FIG. 1.

FIG. 2 is a schematic view of the transmission behavior according to equation (5) for various values $V_0$ with $w_{IN} = w_{OUT}$, whereby a transmission characteristic curve 1 with a negative zero point voltage V01, a transmission characteristic curve 2 with a zero point voltage V02=0, and a transmission characteristic curve 3 with a positive zero point voltage are drawn in. The saturation range in which the circuit operates in a linear fashion is bounded by the voltages $V_{LO}$ and $V_{LU}$. The lower saturation limit $V_{LU}$ is due to the fact that below this value of the output voltage $V_{OUT}$, which simultaneously forms the drain potential of the additional n-MOSFET T20, the operating point of the additional n-MOSFET T20 moves out of the saturation region into the triode area, due to the no longer sufficiently large drain-source voltage. To the extent that the operating point of the additional n-MOSFET T20 does, however, lie in the triode area, the source voltage of the additional n-MOSFET T20, and thus also the drain voltage of the neuron MOSFET T10, is a function of the drain voltage of the additional n-MOSFET T20, i.e. of the output voltage $V_{OUT}$. According to the argumentation in connection with equations (3)–(6b), a precondition of the desired linear transmission behavior is however the constancy of the drain potential of the neuron MOSFET T10, which is no longer fulfilled for output voltages $V_{OUT} \leq V_{LU}$.

A further presupposition for the linear transmission behavior is the constancy of the current impressed via the current source I10. However, real current sources can supply a constant current only insofar as the voltage drop over the current source does not fall below a certain value. Given increasing values $V_{OUT}$ of the output voltage, the voltage drop $VDD-V_{OUT}$ over the current source I10 decreases until a determined boundary value of this voltage drop has been reached, at which the current supplied by the current source I10 begins to deviate from its target value. According to the schematic view in FIG. 2, the value of this voltage drop is $VDD-V_{LO}$.

A suitable dimensioning of the transistors T10 and T20 and of the current source I10, and a suitable choice of the impressed current and of the voltage V20 nonetheless enable the size of the linear saturation range of this circuit to be constructed in such a way that the boundaries $V_{LO}$ and $V_{LU}$ lie close to the respective operating voltages VDD and VSS.

The direct voltage portion $V_0$ of the transmission function according to equation (5) can preferably be set to 0 volts or to a particular well-defined value. There are two possibilities for this:

1. Since the floating gate voltage $V_{FG}$ of the neuron MOSFET T10 is, on the one hand, a function of the impressed cross-current and on the other hand, according to the relation $V_0 = V_{FG} - V_{QP} - V_{CH}$, acts directly on the value $V_0$ of the transmission function according to equation (5), there is the possibility of setting the desired value of $V_0$ by means of a suitable selection of the current I10.
2. If the neuron MOS transistor from FIG. 1 is expanded by an additional coupling gate, so that the circuit sketched in FIG. 3 results, this further coupling gate with the weighting $w_{adj}$ can be used for the compensation of the voltage $V_0$. This means that during operation a constant direct voltage V10, whose value can be compensated given predetermination of $V_0$, must be applied to this coupling gate.

Figure 3:
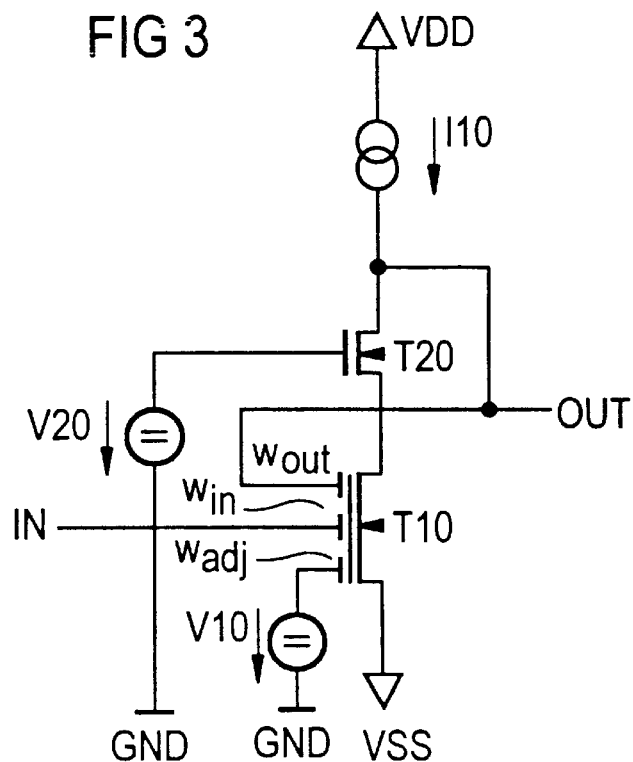
FIG. 3 illustrates an advantageous construction of the amplifier according to FIG. 1 with an additional input for the fine adjustment of the DC operational point.

The output resistance $r_{OUT,ges}$ of the circuit according to FIG. 1 or, respectively, FIG. 3 is calculated from the output resistance $r_{OUT,I10}$ of the current source I10 and the differential output resistance $r_{DS,T20}$ of the transistor T20, approximately as:

$$r_{OUT,ges} = \frac{r_{OUT,I10} \times r_{DS,T20}}{r_{OUT,I10} + r_{DS,T20}} \quad (7)$$

A relatively large output resistance results therefrom. In many cases, it is desirable to have available a circuit with a reduced output resistance. A significant reduction of the output resistance is achieved by means of the addition of a further transistor T30, as well as of a further current source I30 according to FIG. 4. The further transistor T30 works in this circuit as a source follower. The source node of the transistor T30 represents the output of the overall circuit, which here is also connected, analogously to the circuits in FIGS. 1 and 3, with the coupling gate with the weighting $w_{OUT}$ of the neuron MOS transistor T10. The gate of the transistor T30 is connected to the drain node of the additional n-MOSFET T20. The transmission function of this circuit is described by the equations (3)–(6).

Figure 5:
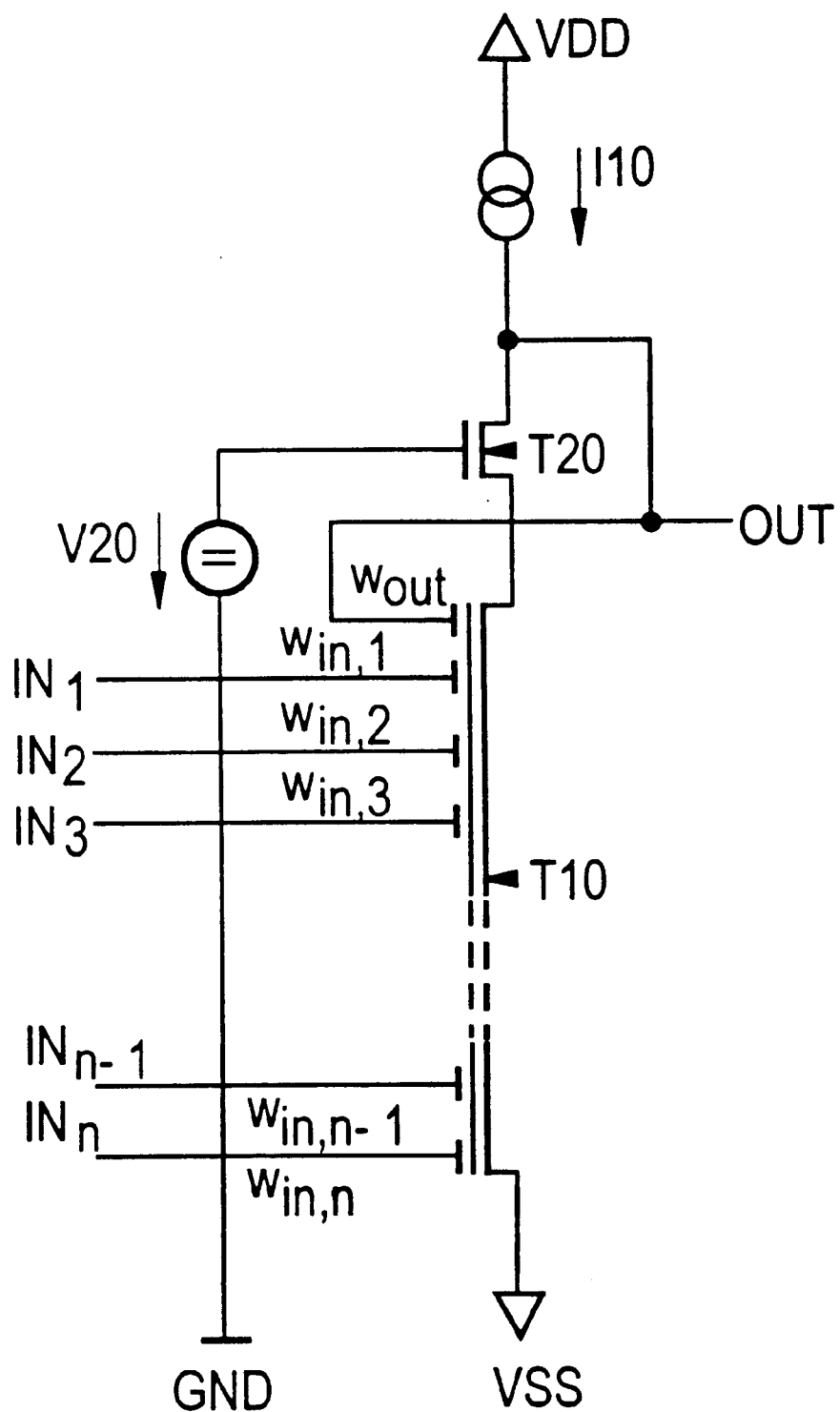
FIG. 5 illustrates an inverting neuron MOS transistor amplifier with k inputs based on an amplifier according to FIG. 1.

A generalization of the circuit in FIG. 1 is shown in FIG. 5. The circuit has an amplifier that adds the input signals from the inputs $IN_1 \ldots IN_n$ with the respective weighting, and provides the sum thereof, amplified in inverting fashion, at its output. In formal notation, the transmission function is:

$$V_{OUT} = \frac{1}{w_{OUT}} \times V_0 - \sum_{i=1}^{n} v_i \times V_{IN,i} \quad (8a)$$

with $$v_i = \frac{w_{IN,i}}{w_{OUT}} \quad (8b)$$

Figure 6:
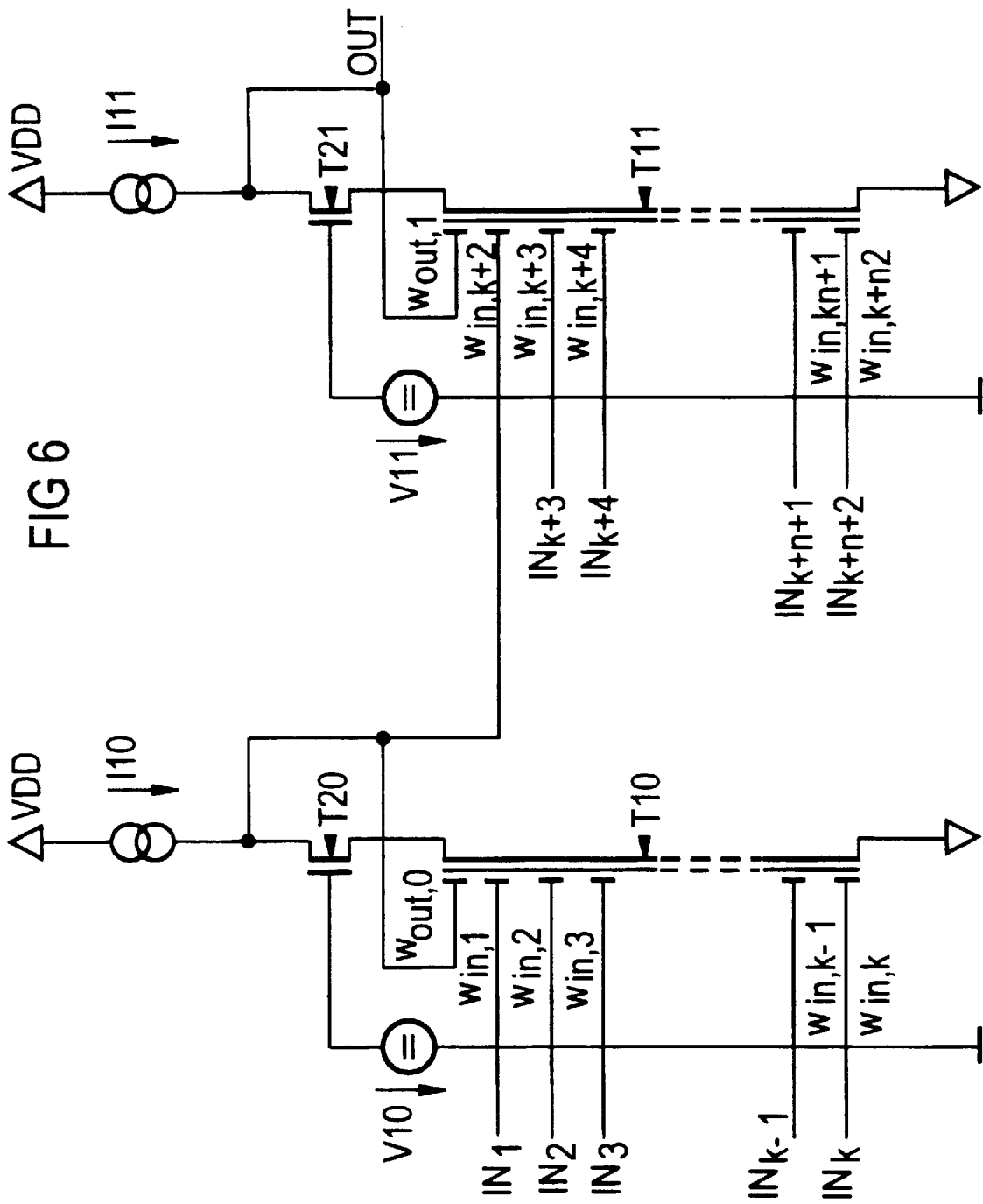
FIG. 6 illustrates a corresponding general summing amplifier with n inverting and k non-inverting inputs.

The measures described above for setting the voltage $V_0$ or, respectively, for increasing the output resistance can also be used in the same way in this circuit. FIG. 6 illustrates a circuit that represents an amplifier or, respectively, summing unit with k non-inverting and n inverting inputs. This circuit results from the cascading of two circuits according to FIG. 5. It is thereby to be taken into account that the neuron MOSFET T11 must contain n+2 coupling gates, given n free signal inputs, whereby one serves for the feedback of the output signal of the overall circuit, and one serves to feed in the output signal of the first stage around MOS transistor T10. By comparison: given k free inputs, the transistor T10 has only k+1 coupling gates. The transmission function of this circuit is:

$$V_{OUT} = \frac{1}{w_{OUT}(T11)} \times V_0(T11) - \sum_{j=k+3}^{k+n+2} v_j \times V_{IN,j} + \\ v_{k+2} \times \left[ -\frac{1}{w_{OUT}(T11)} \times V_0(T10) + \sum_{i=1}^{k} v_i V_{IN,i} \right] \quad (9a)$$

with $$v_i = \frac{w_{IN,i}}{w_{OUT}(T10)} \quad \text{for } i = 1 \ldots k \qquad (9b)$$

and $$v_j = \frac{w_{IN,j}}{w_{OUT}(T11)} \quad \text{for } j = k+3 \ldots k+n+2 \qquad (9c)$$

Of course, in these equations a distinction must be made for the parameters $W_{OUT}$ and $V_0$ as to which of the two neuron MOS transistors they relate. This has been done by means of the indication of the transistor in the parentheses behind the respective parameter.

Figure 4:
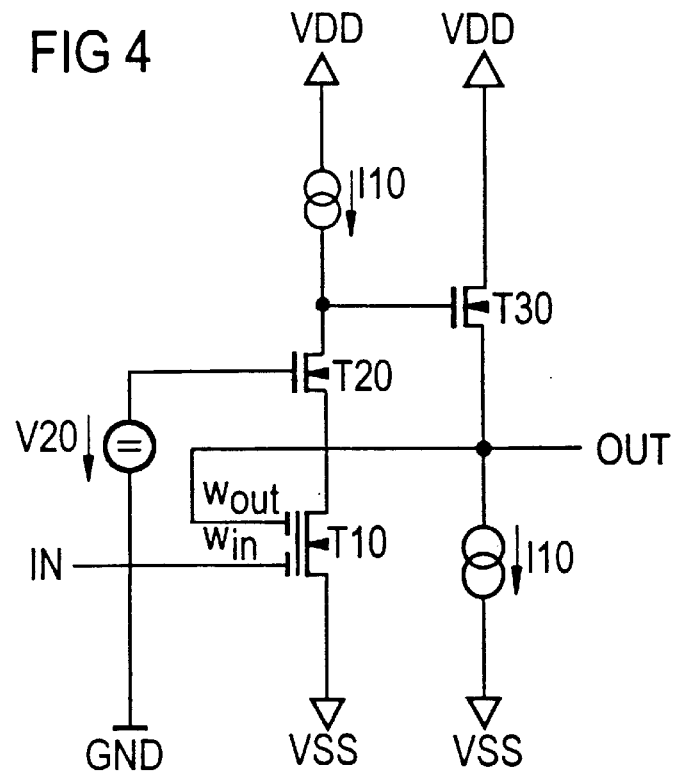
FIG. 4 illustrates a further advantageous development of the amplifier according to FIG. 1 with an additional MOS transistor and a power source for the reduction of the output resistance.

The above-described measures for setting the voltage $V_0$ or, respectively, for increasing the output resistance for each of the two amplifier stages around T10 or, respectively, around T11 can also be applied in this circuit in the same way as was explained in connection with FIG. 3 or, respectively, FIG. 4.

Of course, it is also possible to construct all circuits shown in a manner complementary to the embodiments shown. In this case, the terminals VDD and VSS have to be exchanged, and the transistors T10, T11, T20 and T30 have to be constructed as p-channel transistors.

It should be understood that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the appended claims.

We claim:

1. An amplifier comprising:
   a neuron MOS transistor having a first gate connected with an amplifier input and a second gate of the neuron MOS transistor is connected with an amplifier output wherein a first terminal of an apparatus for keeping a drain voltage constant of the neuron MOS transistor is connected with a constant current source and forms the amplifier output and further wherein a second terminal of the apparatus for keeping the drain voltage constant is connected with a first terminal of the neuron MOS transistor and still further wherein a second terminal of the neuron MOS transistor is connected with a fixed potential.

2. The amplifier according to claim 1 wherein the apparatus for keeping the drain voltage constant of the neuron MOS transistor comprises an MOS transistor whose first terminal, corresponding to said first terminal of said apparatus, is connected with a supply voltage via the constant current source wherein the first terminal of the neuron MOS transistor is connected with a second terminal, corresponding to the second terminal of the apparatus of the MOS transistor and the second terminal of the neuron MOS transistor is connected with reference potential and further wherein a gate of the MOS transistor is connected with a voltage source.

3. The amplifier according to claim 1 wherein the first gate effects an input weighting and the second gate effects an output weighting wherein the weightings ensue via the surfaces of the gates, and still further wherein the gain factor can be set via the selection of the weighting ratio of the input weighting to the output weighting.

4. The amplifier according to claim 1 wherein the neuron MOS transistor comprises a third gate with an adjustment weighting wherein the adjustment weighting ensues over the surface of the third gate, and still further wherein the third gate is connected with an adjustment voltage in order to set the direct voltage operating point.

5. An amplifier comprising:
   a neuron MOS transistor having a first gate connected with an amplifier input and a second gate of the neuron MOS transistor is connected with an amplifier output wherein a first terminal of an apparatus for keeping a drain voltage constant of the neuron MOS transistor is connected with a constant current source and forms the amplifier output and further wherein a second terminal of the apparatus for keeping the drain voltage constant is connected with a first terminal of the neuron MOS transistor and still further wherein a second terminal of the neuron MOS transistor is connected with a fixed potential, and
   the neuron MOS transistor having at least one further gate with a respective input weighting wherein the at least one further gate is connected with a respective further amplifier input such that the amplifier operates as an inverting summing amplifier.

6. The amplifier of claim 5 wherein the respective gain factor can be set by the selection of the weighting ratio of the respective input weighting to the output weighting.

* * * * *